(12) United States Patent
Suzuki et al.

(10) Patent No.: US 7,309,531 B2
(45) Date of Patent: Dec. 18, 2007

(54) EL DEVICE

(75) Inventors: Hiroshi Suzuki, Chiba (JP); Hideaki Gondaira, Tokyo (JP); Yoshio Taniguchi, Nagano (JP)

(73) Assignee: Nippon Soda Co., Ltd. (JP)

( * ) Notice: Subject to any disclaimer, the term of this patent is extended or adjusted under 35 U.S.C. 154(b) by 170 days.

(21) Appl. No.: 10/495,880

(22) PCT Filed: Nov. 21, 2002

(86) PCT No.: PCT/JP02/12152

§ 371 (c)(1),
(2), (4) Date: May 18, 2004

(87) PCT Pub. No.: WO03/045115

PCT Pub. Date: May 30, 2003

(65) Prior Publication Data

US 2005/0003231 A1 Jan. 6, 2005

(30) Foreign Application Priority Data

Nov. 22, 2001 (JP) ............................ 2001-357587

(51) Int. Cl.
*H01L 51/50* (2006.01)

(52) U.S. Cl. .................... 428/690; 428/141; 428/917; 313/504

(58) Field of Classification Search ............... 428/690, 428/917, 141; 313/503, 504
See application file for complete search history.

(56) References Cited

U.S. PATENT DOCUMENTS

| | | | | |
|---|---|---|---|---|
| 5,420,708 A | * | 5/1995 | Yokoyama et al. | 349/149 |
| 6,617,056 B1 | * | 9/2003 | Hara et al. | 428/697 |
| 6,743,488 B2 | * | 6/2004 | Memarian et al. | 428/1.4 |
| 6,788,376 B2 | * | 9/2004 | Izumi et al. | 349/139 |
| 6,864,629 B2 | * | 3/2005 | Miyaguchi et al. | 313/512 |

FOREIGN PATENT DOCUMENTS

| | | |
|---|---|---|
| EP | 0987774 | 3/2000 |
| JP | 8-185983 | 7/1996 |
| JP | 2000-91084 | 3/2000 |
| JP | 2000-128698 | 5/2000 |

OTHER PUBLICATIONS

JPO abstract and computer-generated translation for JP 08-185983, publication date Jul. 16, 1996.*

JPO abstract and computer-generated translation for JP 2000-128698, publication date May 9, 2000.*

* cited by examiner

*Primary Examiner*—Dawn L. Garrett
(74) *Attorney, Agent, or Firm*—Darby & Darby P.C.

(57) ABSTRACT

The present invention relates to an EL device which is driven with a lower voltage or power amount, which is superior in interface stability between layers in the device and which has a higher luminance as compared with the use of a conventional electrode, and is characterized in that in the EL device comprising a light emitting layer disposed as an essential layer between two electrodes facing each other, at least one of the electrodes includes a crystalline conductive film whose diffraction intensity ratio of (400)/(222) is 1.0 or more in X-ray diffraction by a θ/2θ method.

13 Claims, 1 Drawing Sheet

FIG.1

6 PROTECTIVE ELECTRODE
5 ELECTRON INJECTION ELECTRODE
4 LIGHT EMITTING LAYER
3 HOLE INJECTION/TRANSPORT LAYER
2 HOLE INJECTION ELECTRODE
1 SUBSTRATE

EL DEVICE

TECHNICAL FIELD

The present invention relates to an electrode for use in an EL device, further particularly to an improvement of a hole injection electrode which supplies a hole (positive hole) to a light emitting layer using an organic compound.

BACKGROUND ART

In recent years, considerable research has been done on an organic EL device. It has been noted that this is a device having a basic constitution in which hole transport materials such as triphenyl diamine (TPD) are formed into a thin film on a hole injection electrode by vapor deposition, fluorescent materials such as alumiquinolinol complex (Alq3) are further stacked as a light emitting layer, and metal electrodes (electron injection electrode) having a small work function, such as Mg, are formed, and a remarkably high luminance of several 100 to several 10,000 $cd/m^2$ is obtained at a voltage of around 10 V.

It is considered that materials for use as the hole injection electrode of the organic EL device, which inject many holes into the light emitting layer, hole injection/transport layer or the like, are effective. In many cases, a constitution for usually taking an emitted light from a substrate side is used, and a transparent conductive material is required.

As this transparent electrode, indium tin-doped oxide (ITO), indium zinc-doped oxide (IZO), ZnO, $SnO_2$, $In_2O_3$ or the like is known. Above all, an ITO electrode is used as a transparent electrode having both a visible ray transmittance of 90% or more and a sheet resistance of 10 $\Omega/\square$ or less, broadly used as the transparent electrode for a liquid crystal display (LCD), light control glass, solar battery and the like, and regarded as promising also as the hole injection electrode for the organic EL device.

Additionally, the organic EL device tends to be degraded with an elapse of time, and prevention of degradation of the device is an important problem. Various causes are considered as factors which degrade the device, but the degradation of a film interface between an electrode and an organic layer largely influences device life or emission characteristics, and it is an important problem to modify physical properties in the film interface. Moreover, a generation/enlargement phenomenon or the like of a non-emission region, referred to as an abnormal emission phenomenon or dark spot by a leak current, also needs to be prevented.

As an improvement of the electrode, in Japanese Patent Application Laid-Open No. 11-87068, it has been described that an ITO electrode having a (111) orientation and preferably having a diffraction intensity ratio of (400)/(222) of 0.6 or less in X-ray diffraction by a θ/2θ process is used as the ITO electrode which is a hole injection electrode. Furthermore, it is described that an electrode having an average surface roughness of ITO electrodes of Ra≦10 nm and a maximum surface roughness of Rmax≦50 nm is preferably used.

Moreover, in Japanese Patent Application Laid-Open No. 6-76950, an organic EL device is described in which a light emitting layer formed of an organic compound is disposed as an essential layer between two electrodes facing each other, an electron injection/transport layer formed of an organic compound is disposed if desired, and at least one of two electrodes is a transparent or translucent electrode. In the organic EL device, a size of a micro crystal grain on the surface of the transparent or translucent electrode, contacting the light emitting layer or the electron injection/transport layer, is 500 angstroms or less. By the use of this electrode, luminance unevenness and emission stability can be improved.

DISCLOSURE OF THE INVENTION

There has been a problem that the improvement of the electrode described in any of the above-described publications is insufficient as an improvement for obtaining an EL device driven at a lower voltage to emit a light with a high luminance. If the driving voltage is low and high-luminance emission is obtained, influences on an organic compound in a light emitting layer, or an interface between the electrode and the light emitting layer or a hole injection/transport layer can be reduced, and therefore it can be said that there is a possibility that even the problems described in the above-described publications can be solved.

An object of the present invention is to provide an EL device which is driven at a low voltage or current amount and which is superior in interface stability between layers in the device and which has a high luminance as compared with the use of a conventional electrode.

As a result of intensive studies to solve the above-described problems, the present inventors have found that the above-described problems can be solved, when orientation of a crystal constituting a conductive film as an electrode for use, a size of the crystal, flatness of a film surface, and an atomic composition in the film are set to certain specific values, and have completed the present invention.

That is, the present invention relates to the followings.

(1) An EL device comprising: a light emitting layer disposed as an essential layer between two electrodes facing each other, wherein at least one of the electrodes includes a crystalline conductive film whose diffraction intensity ratio of (400)/(222) is 1.0 or more in X-ray diffraction by a θ/2θ process.

(2) The EL device according to (1), wherein the crystalline conductive film is an aggregate of columnar single crystals.

(3) The EL device according to (1) or (2), wherein the crystalline conductive film is a crystal aggregate in which a size of a crystallite in a longitudinal direction is in a range of 20 to 100 nm.

(4) The EL device according to one of (1) to (3), wherein a maximum surface roughness of the crystalline conductive film is in a range of 5 to 30 nm.

(5) The EL device according to one of (1) to (4), wherein an average surface roughness of a crystalline conductive film surface is in a range of 1 to 10 nm.

(6) The EL device according to one of (1) to (5), wherein the number of 5 to 30 nm protrusions existing in a 1 μm square region in the crystalline conductive film surface is 100 or more.

(7) An EL device comprising: a light emitting layer disposed as an essential layer between two electrodes facing each other, wherein the number of 5 to 30 nm protrusions existing in a 1 μm square region in the surface of at least one of the electrodes is 100 or more.

(8) The EL device according to (7), wherein a maximum surface roughness of at least one of the electrodes is in a range of 5 to 30 nm.

(9) The EL device according to (7) or (8), wherein an average surface roughness of at least one of the electrodes is in a range of 1 to 10 nm.

(10) The EL device according to one of (7) to (9), wherein at least one of the electrodes is an aggregate of crystals having a (100) surface orientation.

(11) The EL device according to one of (7) to (10), wherein at least one of the electrodes comprises a crystal aggregate in which a size of a crystallite in a longitudinal direction is in a range of 20 to 100 nm.

(12) The EL device according to one of (7) to (11), wherein at least one of the electrodes is an aggregate of columnar single crystals.

(13) An EL device comprising: a light emitting layer disposed as an essential layer between two electrodes facing each other, wherein at least one of the electrodes comprises a thin film of indium tin oxide, and tin atoms are uniformly distributed toward a film surface from a substrate in the thin film.

(14) The EL device according to (13), wherein the indium tin oxide film is a crystal aggregate having a (100) surface orientation.

(15) The EL device according to (13) or (14), wherein the thin film of indium tin oxide is an aggregate of columnar single crystals.

(16) The EL device according to one of (13) to (15), wherein the thin film of indium tin oxide is a crystal aggregate in which a size of a crystallite in a longitudinal direction is in a range of 20 to 100 nm.

(17) The EL device according to one of (13) to (16), wherein a maximum surface roughness of the thin film of indium tin oxide is in a range of 5 to 30 nm.

(18) The EL device according to one of (13) to (17), wherein an average surface roughness of the thin film of indium tin oxide is in a range of 1 to 10 nm.

(19) The EL device according to one of (12) to (18), wherein the number of 5 to 30 nm protrusions existing in a 1 μm square region in the surface of the thin film of indium tin oxide is 100 or more.

(20) An EL device comprising: a light emitting layer disposed as an essential layer between two electrodes facing each other, wherein at least one of the electrodes is a conductive film manufactured on a substrate by a spray thermal decomposition process or a pyro-sol process.

(21) The EL device according to (20), wherein the conductive film is formed at a temperature on the substrate in a range of 400 to 750° C.

(22) The EL device according to (20) or (21), wherein the conductive film is a crystal aggregate having a (100) surface orientation.

(23) The EL device according to (20) to (22), wherein the conductive film is an aggregate of columnar single crystals.

(24) The EL device according to (20) to (23), wherein the conductive film is a crystal aggregate in which a size of a crystallite in a longitudinal direction is in a range of 20 to 100 nm.

(25) The EL device according to one of (20) to (22), wherein a maximum surface roughness of the conductive film is in a range of 5 to 30 nm.

(26) The EL device according to one of (20) to (25), wherein an average surface roughness of the conductive film is in a range of 1 to 10 nm.

(27) The EL device according to one of (20) to (26), wherein the number of 5 to 30 nm protrusions existing in a 1 μm square region in a conductive film surface is 100 or more.

(28) The EL device according to one of (1) to (27), wherein at least one of the electrodes is a hole injection electrode.

(29) The EL device according to one of (1) to (28), wherein an organic compound is used in the light emitting layer.

In the EL device of the present invention, the light emitting layer is disposed as the essential layer between two electrodes facing each other, and at least one of the electrodes includes the crystalline conductive film in which a diffraction intensity ratio of (400)/(222) is 1.0 or more in the X-ray diffraction by the θ/2θ process.

In the electrode comprising the crystalline conductive film of the present invention, (400) may be detected as a main orientation surface in the X-ray diffraction, and (222), (211), (411) or the like may also be detected as another orientation at a level smaller than that of the main orientation. When a main orientation ratio is represented by a (400)/(222) ratio in the X-ray diffraction intensity by the θ/2θ process, the ratio is preferably 1.0 or more. When the ratio is less than 1.0, the driving voltage is high for the EL device of the present invention indicating 1.0 or more, and a luminance drops in the same driving voltage. When the ratio is 1.0 or more, the diffraction intensity of the (222) surface is not especially limited, and may also be 0.

Moreover, in the EL device of the present invention, when a microfine structure of the surface of the constituting electrode is concave/convex, a charge or a hole injection efficiency advantageously increases, and especially a uniformly distributed concave/convex surface is preferable. For example, when the protrusion number on the surface is used as in index for evaluating a surface concave/convex uniformity, the number of 5 to 30 nm protrusions existing in the 1 μm square region is preferably 100 or more. In this case, the protrusion number means an average value of the number of 5 to 30 nm protrusions existing in the 1 μm square region. It is to be noted that in this case, the protrusion indicates a clearly raised and recognized protrusion on an image obtained in a case where the surface is measured using an interatomic force microscope (AFC), scanning transmission microscope (STM), scanning electron microscope (SEM) or the like. A length of the protrusion is a value measured from a place having a lowest level in a trough of a sectional curve of a surface roughness of the crystalline conductive film surface. When the number of protrusions is less than 100, a high voltage is locally generated to cause luminance unevenness or the like. When the number is 100 or more, an upper limit of the number of protrusions is not especially limited. A shape of the protrusion is not especially limited, but a protrusion top portion preferably has a shape which does not have an acute angle in consideration of contact with a hole transport layer or the like.

The electrode is preferably used especially as an anode, that is, a hole injection electrode.

As a material for use in the anode, for example, a metal, alloy, electrically conductive compound or mixture having a large (4 eV or more) work function is preferably usable, and concrete examples may include metals such as Au. Moreover, the material usually has a constitution in which an emitted light is taken out of a substrate side in many cases, and therefore a transparent conductive material is preferable. As this transparent conductive material, indium tin-doped oxide (ITO), indium zinc-doped oxide (IZO), ZnO, $SnO_2$, $In_2O_3$, CuI or the like is usable. They may be used as main components and, if necessary, one or two or more selected from a group consisting of oxide of Ir, Mo, Mn, Nb, Os, Re, Ru, Rh, Cr, Fe, Pt, Ti, W, and V may be contained in all the metals in the film by 0.1 to 5 at %, for example, in terms of metals. If necessary, one or two or more selected from a group consisting of C, N, H, F, B, P, S, As, and Si elements may also be contained by 5 at % or less, for example, with respect to all metal atoms in the film.

A transmittance of the conductive film at the time when this material is used is 80% or more in a total transmittance, further preferably 80% or more in a linear transmittance.

When ITO is used as the conductive material, usually $In_2O_3$ and $SnO_2$ are contained in a stoichiometric composition, and an oxygen amount may slightly deviate. When $InO_x.SnO_y$, X is preferably in a range of 1.0 to 2.0, and Y is in a range of 1.6 to 2.4. A mixture ratio of $SnO_2$ to $In_2O_3$ is in a range of preferably 0.05 to 40 wt %, more preferably 1 to 20 wt %, further preferably 5 to 12 wt %.

When the electrode constituting the EL device of the present invention is an ITO film, tin atoms in the film are uniformly distributed toward the film surface from the substrate surface. Since tin does not segregate on the surface of the film or in the film, the injection efficiency of holes or electrons rises. In this case, uniformity indicates a state in which an indium/tin atom ratio is not inclined in a depth direction, and the indium/tin atom ratio in each depth is held within an error range of 10% or less. In this case, for example, the film surface segregates, and a segregating portion is removed in a subsequent post-treatment process. Accordingly, the uniformed film is included in the present invention, when the indium/tin atom ratio is within an error range of 10% or less. However, when tin atoms is uniformly distributed toward the film surface from the substrate in the film immediately after film formation, a uniform film is more preferably obtained without requiring any post-treatment process.

A method of manufacturing the electrode constituting the EL device of the present invention is not especially limited as long as the thin film is formed on the substrate in the method, concrete examples may include a sputtering method, an electron beam method, an ion plating method or a chemically vapor development method (CVD method), a spray thermal decomposition method, a pyro-sol method, and the like, but especially the spray thermal decomposition method, or the pyro-sol method is preferably usable.

More concretely, according to the sputtering method, a mixture of a metal (e.g., indium, zinc, etc.) and a doped metal (e.g., tin, fluorine, fluorine compound, aluminum, etc.) and oxygen gas, or metal oxides (e.g., indium oxide, zinc oxide, etc.) are sintered and used as a target. By the electron beam method or the ion plating method, a mixture of a metal (e.g., indium, zinc, etc.) and a doped metal (e.g., tin, fluorine, fluorine compound, aluminum, etc.) and oxygen gas, or metal oxides (e.g., indium oxide, zinc oxide, etc.) are sintered and used as an evaporated material. Accordingly, the transparent conductive film can be formed.

When the conductive film comprising ITO is formed using the sputtering method, the film is preferably formed by a DC sputtering or RF sputtering method using a target of $In_2O_3$ doped with $SnO_2$. A projected power is in a range of preferably 0.1 to 10 $W/cm^2$, more preferably 0.1 to 4 $W/cm^2$. Especially a power for a DC sputtering device is in a range of preferably 0.1 to 10 $W/cm^2$, especially preferably 0.2 to 7 $W/cm^2$. A film forming rate is in a range of preferably 2 to 100 nm/min, especially preferably 5 to 50 nm/min.

A sputtering gas is not especially limited, and an inactive gas of Ar, He, Ne, Kr, Xe or the like or a mixed gas may be used. These gases may also contain 20% or less of $O_2$. A pressure at a sputtering time of the sputtering gas may be usually about 0.1 to 20 Pa.

A substrate temperature at a film forming time is in a range of preferably 150 to 500° C., especially preferably 200 to 400° C. When the substrate temperature is low, crystal growth is not promoted at the film forming time, and (100) orientation is not easily formed.

A heating treatment can be performed, if desired, after forming the conductive film such as ITO. A heating treatment temperature is in a range of preferably 100 to 550° C., more preferably 150 to 300° C., and a treatment time is preferably 0.1 to 3 hours, more preferably 0.3 to 1 hour. A treatment atmosphere is preferably atmospheric air, nitrogen, oxygen, hydrogen added nitrogen atmosphere, organic solvent added atmospheric air, nitrogen atmosphere or the like.

Moreover, in further detail, as an indium compound for use in the CVD method, spray thermal decomposition method, pyro-sol method or the like, a material thermally decomposed to form indium oxide is preferable. Concrete examples may include indium trisacetyl acetonate (In$(CH_3COCHCOCH_3)_3$), indium trisbenzoyl methanate (In$(C_6H_5COCHCOC_6H_5)_3$), indium trichloride ($InCl_3$), indium nitrate (In$(NO_3)_3$), indium triisopropoxide (In$(OPr-i)_3$) and the like. Above all, indium trisacetyl acetonate is especially preferably usable.

Moreover, as a tin compound, a compound thermally decomposed to form stannic oxide is preferably usable. Concrete example may include stannic chloride, dimethyl tin dichloride, dibutyl tin dichloride, tetrabutyl tin, stannous octoate (Sn$(OCOC_7H_{15})_2$), dibutyl tin maleate, dibutyl tin acetate, dibutyl tin bisacetyl acetonate and the like.

It is to be noted that in addition to the indium compound and tin compound, as a third component, periodic table group II elements such as Mg, Ca, Sr, and Ba, group III elements such as Sc, Y, lanthanoids such as La, Ce, Nd, Sm, Gd, group IV elements such as Ti, Zr, Hf, group V elements such as V, Nb, Ta, group VI elements such as Cr, Mo, W, group VII elements such as Mn, group IX elements such as Co, group X elements such as Ni, Pd, Pt, group XI elements such as Cu, Ag, group XII elements such as Zn, Cd, group XIII elements such as B, Al, Ga, group XIV elements such as Si, Ge, Pb, group XV elements such as P, As, Sb, group XVI elements such as Se, Te and the like alone or a compound is preferably added to form the ITO film.

An addition ratio of these elements is preferably 0.05 to 20 at % with respect to indium, the addition ratio differs with an added element, and an element and addition amount may appropriately be selected in accordance with a targeted resistance value.

As a method of forming the ITO film on a glass substrate by the pyro-sol method or the spray thermal decomposition method, the film can be manufactured by a method in which after dissolving the above-described indium compound and tin compound into organic solvents of alcohols such as methanol and ethanol, ketone such as acetone, methyl butyl ketone, and acetyl acetone or the like to constitute a mixed solution, the mixed solution is formed into particulates and dispersed in a carrier gas, and brought into contact with a glass substrate heated beforehand at 400 to 750° C., preferably 400 to 550° C. under atmospheric pressure. The mixed solution is formed into the particulates by an ultrasonic atomization method, spraying method or the like. The ultrasonic atomization method capable of stably producing the particulates having uniform particulate diameters is preferable. An oxidizing gas, or usually air is used as a carrier gas.

When the pyro-sol method or the spray thermal decomposition method is used, a crystal nucleus having an ITO film composition is produced on the glass substrate by the contact of the particulates of the mixed solution with the glass substrate. When the nucleus grows, it contacts an adjacent nucleus, the contact nuclei are mutually bound, and grow mainly in a vertical direction with respect to the substrate surface. As a result, the ITO film which is a complex of oriented columnar single crystals is easily obtained.

As a substrate material, materials such as glass, quartz, resin, ceramic, and metal are preferably used. Above all, the glass substrate or a resin substrate is preferable which is inexpensive, easily obtainable, and superior in physical aspects such as transmittance. The glass substrate can be roughly classified into alkali glass and non-alkali glass. The alkali glass is inexpensive and easily obtainable, and cost merits are large, but contains about 13 to 14% of alkali metal oxide. Therefore, there are defects that a countermeasure for preventing contamination from these alkali metals is required, and heat resistance is inferior. On the other hand, the non-alkali glass does not have any fear that the alkali metal is contaminated, and has a certain degree of heat resistance, but is comparatively expensive.

As the alkali glass, for example, soda lime glass or the like is known having a composition of $SiO_2$: 72 wt %, $Al_2O_3$: 2 wt %, CaO: 8 wt %, MgO: 4 wt %, $Na_2O$: 13.5 wt %. As the non-alkali glass, for example, borosilicate (7059) glass having a composition of $SiO_2$: 49 wt %, $Al_2O_3$:10 wt %, $B_2O_3$:15 wt %, and BaO: 25 wt %; borosilicate (AN) glass having a composition of $SiO_2$: 53 wt %, $Al_2O_3$:11 wt %, $B_2O_3$: 11 wt %, CaO: 2 wt %, MgO: 2 wt %, BaO: 15 wt %, ZnO: 6 wt %; borosilicate (NA-40) glass hg a composition of $SiO_2$: 54 wt %, $Al_2O_3$: 14 wt %, $B_2O_3$: 15 wt %, MgO: 25 wt % or the like is known.

As the surface roughness of the substrate of glass or the like, the average surface roughness $Ra \leq 10$ nm, and the maximum surface roughness $Rmax \leq 50$ nm are preferable. Especially, in the substrate using alkali glass, the average surface roughness $Ra \leq 10$ nm, and the maximum surface roughness $Rmax \leq 50$ nm are preferable. In the substrate using non-alkali glass, the average surface roughness $Ra \leq 5$, and the maximum surface roughness $Rmax \leq 20$ nm are preferable. The lower limit value is not especially regulated, and usually the average surface roughness is $Ra \geq 0.1$ nm, and the maximum surface roughness is $Rmax \geq$ about 0.5 nm.

As a method of adjusting the surface roughness of the glass substrate in the above-described range, mirror surface polishing may be performed using diamond, cerium oxide or the like.

It is to be noted that with the use of alkali glass, to prevent the contamination by the alkali metal components and the like from the substrate, after forming a barrier layer of $SiO_2$ or the like on the substrate, a conductive film of ITO or the like may be formed. The barrier layer can be formed by a vapor deposition method, sputtering method or the like, and the film thickness is preferably about 5 to 50 nm. It is to be noted that when the barrier layer is formed, alkali glass may have the average surface roughness $Ra \leq 10$ nm, and the maximum surface roughness $Rmax \leq$ about 50 nm.

Concrete examples of a resin may include a film, sheet or plate formed of polyester such as polycarbonate, polyethylene terephthalate, and polyarylate, polyether sulfonic resin, amorphous polyolefin, polystyrene, acryl resin or the like.

Especially from respects of transparency and moldability, a material formed of a polyolefin-based transparent thermosetting resin is preferable, and polyolefin-based copolymer obtained by polymerizing a composite containing multifunctional monomer including two or more unsaturated groups is more preferably used.

Concrete examples of the multifunctional monomer including two or more unsaturated groups include: (i) di-, tri-, tetra-(meth)acrylates of multivalent alcohols, such as ethylene glycol di(meth)acrylate, diethylene glycol di(meth) acrylate, triethylene glycol di(meth)acrylate, glycerol di(meth)acrylate, glycerol tri(meth)acrylate, trimethylolpropane di(meth)acrylate, trimethylolpropane tri(meth)acrylate, pentaerythritol di(meth)acrylate, and pentaerythritol tetra (meth)acrylate; (ii) aromatic multifunctional monomers such as p-divinyl benzene and o-divinyl benzene; (iii) esters such as (meth)acrylate vinyl ester, and (meth)acrylate aryl ester; (iv) dienes such as butadiene, hexadiene, and pentadiene; (v) monomers having a phosphagen framework in which dichlorophosphagen is used as a raw material and a polymer multifunctional group is introduced; (vi) multifunctional monomers having a hetero-atomic annular framework, such as triaryl isocyanurate and the like.

From viewpoints of light resistance, resistance to oxidation/deterioration, and antistatic property, the transparent thermosetting resin preferably contains various ultraviolet absorbents, oxidation preventives, and charging preventives. When the transparent thermosetting resin is the polyolefin-based copolymer, the polyolefin-based copolymer preferably uses a monomer having an ultraviolet absorption property or an antioxidant property. Preferable examples of the monomer include benzophenone-based ultraviolet absorbent having unsaturated double coupling, phenyl benzoate-based ultraviolet absorbent having the unsaturated double coupling, a (meth)acryalate monomer including a hindered amino group as a substituent and the like. These monomers are preferably used in a range of 0.5 to 20 wt % with respect to a total amount of monomers for use in obtaining a targeted polyolefin-based copolymer.

In a surface state of the resin substrate for use, a root-mean-square value of the surface roughness is 300 angstroms or less, and the number of 600 angstroms or more protrusions existing in a 500 μm square region on a flat surface is preferably 20 or less on the surface. It is to be noted that "the root-mean-square value of the surface roughness" mentioned with respect to the flat surface in the present invention is a root-mean-square value of deviation from an average value of a height of a concave/convex surface, and means a size of the concave/convex portion of the surface. Moreover, "the number of 600 angstroms or more protrusions existing in the 500 μm square region on the flat surface" mentioned in the present invention means the average value of the number of protrusions having a height of 600 angstroms or more and existing in each of ten 500 μm square regions optionally disposed on the flat surface. The height and number of protrusions in each region can be obtained using an electron microscope, interatomic force microscope or the like.

The substrate may also be obtained by any polymerization method and molding method as long as the flat surface is disposed. The thickness is appropriately selectable in accordance with application or the like of the targeted organic EL device. When the transparent thermosetting resin substrate is formed of the polyolefin-based copolymer, the thickness is preferably 0.1 to 1.5 mm, more preferably 0.1 to 1.0 mm in consideration of mechanical characteristics.

An inorganic oxide film provided with a gas barrier property may be formed on the substrate surface, if necessary, in order to prevent oxygen, moisture, alkali component or the like from entering an organic single layer portion or an organic multilayered portion containing organic emission materials described later. Concrete examples of the inorganic oxide film may include silicon oxide ($SiO_x$), aluminum oxide ($Al_2O_x$), titanium oxide ($TiO_x$), zirconium oxide ($ZrO_x$), yttrium oxide ($Y_2O_x$), ytterbium oxide ($Yb_2O_x$), magnesium oxide ($MgO_x$), tantalum oxide ($Ta_2O_x$), cerium oxide ($CeO_x$), or hafnium oxide ($HfO_x$), a polysilane film formed of an organic polysilane compound, an $MgF_2$ film, a $CaF_2$ film, and a film formed of composite oxide of $SiO_x$ and $TiO_x$.

The film thickness of the inorganic oxide film is appropriately changeable by the material, but is generally in a range of 5 to 200 nm. When the film thickness is excessively thin, a desired gas barrier property cannot be imparted to the substrate. On the other hand, when the film thickness is excessively large, transmittance drops and, as a result, a luminance of the organic EL device drops. The film thickness of the inorganic oxide film is preferably 10 to 120 nm.

The flatness of the surface of the inorganic oxide film is preferably as high as that of a flat surface in the above-described substrate which is an underlayer of the inorganic oxide film in obtaining the organic EL device which does not have luminance unevenness and which has a high emission stability. The inorganic oxide film having such flatness can be formed by methods such as the sputtering method of a direct-current system, magnetron system, high-frequency discharge system or the like, a vacuum deposition method, an ion plating method, a plasma CVD method, a dipping method, the spray thermal decomposition method, and the pyro-sol method. Even when the inorganic oxide film is formed by any method, a substrate temperature at the film forming time is preferably a temperature at which the substrate does not substantially cause thermal deformation. When the resin substrate causes thermal deformation at the film forming time of the inorganic oxide film, it is difficult to obtain the organic EL device that does not have any luminance unevenness and that has the high emission stability.

Even when the conductive film formed on the substrate as described above is further irradiated with UV ozone, or ions such as an oxygen ion, nitrogen ion, and argon ion, the conductive film having the concave/convex surface, which is a characteristic of the present invention, can be obtained. For example, conditions of the UV ozone irradiation are that a main wavelength of a light source is 2537 angstroms, 1849 angstroms, an oxygen gas introduction amount in an irradiation tank is 10 liters/minute, a substrate temperature is 10 to 30° C., and an irradiation time is ten minutes to five hours. The conditions of the ion irradiation include, for example, an inner pressure in the irradiation tank of $10^{-6}$ to $10^{-1}$ Pa, an irradiation driving voltage of 10 to 1000 V, and an irradiation time of ten seconds to one hour.

Moreover, the UV ozone irradiation and ion irradiation may also be performed with respect to the conductive film having a desired surface concave/convex state. When the UV ozone irradiation or the ion irradiation is performed, the conductive film surface can be cleaned without damaging the substrate.

The electrode constituting the EL device of the present invention having the above-described characteristics is preferably a crystalline conductive film. The film structure is not especially limited, and bulk crystals may also be stacked in a structure, but above all, an aggregate of columnar single crystals is preferable. In this case, especially the (100) surface orientation becomes strong, and the EL device having a low driving voltage and high luminance can be manufactured.

In the crystalline conductive film, a size of a surface crystallite contacting the light emitting layer, electron injection/transport layer, or hole injection/transport layer in a longitudinal direction, that is, a grain size is preferably in a range of 20 to 100 nm. When the size is 100 nm or more, a local concave/convex state is enlarged. As a result, a high voltage is locally generated, luminance unevenness is caused, and deterioration is accelerated to lower the emission stability. The local high voltage accelerates the crystallization of the organic compound in the light emitting layer, and the luminance unevenness and emission stability are lowered. When the size is 20 nm or less, the crystal does not sufficiently grow into a (100) surface direction, the electron or hole cannot be efficiently transported into the light emitting layer or the like at a low voltage, and emission efficiency drops.

The shape of the crystallite is not especially limited, but a spherical shape or a rotary elliptic shape is preferable, and there are preferably less protrusions or corners. It is to be noted that the shape and size of the crystallite can be evaluated by observation of the surface using a transmission microscope (TEM).

Moreover, in the crystalline conductive film of the present invention, the maximum surface roughness (Rmax) of the surface contacting the light emitting layer, electron injection/transport layer, or hole injection/transport layer is in a range of preferably 5 to 30 nm, more preferably 5 to 20 nm in the film. In the contact surface, the protrusion or roughness of the electrode surface has heretofore been suppressed, and it has been effective to flatten the surface as much as possible in order to prevent emission defects by a leak current, generation of a dark spot, and deterioration of the device with an elapse of time. However, when there is a concave/convex in the structure of a microfine surface, a surface area increases, and the injection efficiency of the electron or hole rises. Therefore, when Rmax is 5 nm or less, the surface is too flat, and the injection efficiency of the electron or hole drops. When the roughness is 30 nm or more, the local concave/convex is enlarged. As a result, a high voltage is locally generated, luminance unevenness is caused, and the deterioration is accelerated to lower the emission stability. In the above description, from another viewpoint, the average film surface roughness (Ra) is preferably in a range of 1 to 10 nm. When Ra is less than 1 nm, the surface is excessively flat, and the injection efficiency of the electron or hole drops. When the roughness is larger than 10 nm, the local concave/convex is enlarged. As a result, the high voltage is locally generated, the luminance unevenness is caused, and the deterioration is accelerated to lower the emission stability.

As described above, the thickness of the conductive film for use in the electrode may be a certain or more thickness by which the hole or electron can be sufficiently injected, and is in a range of preferably 10 to 500 nm, further preferably 20 to 200 nm. Moreover, an upper limit is not especially limited. However, when the film is excessively thick, a fear of peeling or the like occurs. When the film is excessively thin, there is a problem in film strength or a hole transport capability at a manufacturing time.

The EL device manufactured in the present invention includes the hole injection electrode on the substrate, and further the electron injection electrode. At least a charge transport layer and a light emitting layer are disposed between these electrodes, and a protective electrode is further disposed as an uppermost layer. It is to be noted that the charge transport layer may be omitted. Moreover, the electron injection electrode comprises a metal, compound, or alloy formed by vapor deposition, sputtering, or the like, preferably the sputtering and having a small work function, and the hole injection electrode comprises the above-described constitution.

As the constituting material of the electron injection electrode formed in the film, a material which effectively injects the electrons and which has a low work function is preferable. For example, simple metal elements such as K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb, or compounds such as BaO, BaS, CaO, HfC, LaB$_6$, MgO, MoC, NbC, PbS, SrO, TaC, ThC, ThO$_2$, ThS, TiC, TiN, UC, UN, UO$_2$, W$_2$C, Y$_2$O$_3$, ZrC, ZrN, and ZrO$_2$ may be used. Two-component, three-component alloy containing the metal elements is preferably used in order to enhance the stability. As an alloy base, for example, aluminum-based alloys such as Al.Ca (Ca: 0.01 to 20 at %, especially 5 to 20 at %), Al.In (In: 1 to 10 at %), and Al.Li (Li: 0.01 to 14 at %, especially 0.3 or more and less than 14 at %), In.Mg (Mg: 50 to 80 at %) and the like are preferable. Above all, especially a simple Al material, and aluminum-based alloys such as Al.Li (Li: 0.4 to 6.5 (additionally, 6.5 is not included) at %) or (Li: 6.5 to 14 at %) are preferable because a compressive stress is not easily generated. Therefore, as a sputtering target, the electron injection electrode constituting metal or alloy is usually used. The work function is 4.5 eV or less, and the metal or alloy having a work function of 4.0 eV or less is especially preferable.

When the sputtering method is used in forming the film of the electron injection electrode, in the formed electron injection electrode film, sputtered electron or electron group has a comparatively high movement energy as compared with the vapor deposition. Therefore, a surface migration effect works, and adhesion in an organic layer interface is enhanced. Moreover, when pre-sputtering is performed, a surface oxide layer is removed in vacuum, moisture or oxygen adsorbed by an organic layer interface can be removed by reverse sputtering, and therefore a clean electrode-organic layer interface or electrode can be formed. As a result, a high-level stable organic EL device can be obtained. As a target, an alloy or a metal alone in the composition range may also be used. Additionally, a target of an added component may also be used. Furthermore, even when a mixture of materials having largely different steam pressures is used as the target, there is little deviation of the composition between the film to be produced and the target, and the material for use is not limited by the steam pressure as in the vapor deposition method. It is not necessary to supply the material for a long time as compared with the vapor deposition, uniformity in film thickness or film quality is superior, and productivity is advantageous.

The electron injection electrode formed by the sputtering method is a dense film, and therefore an organic EL device is obtained in which very little moisture enters the film as compared with a coarse deposited film and which has a high chemical stability and a long life.

A pressure of a sputtering gas at a sputtering time is in a range of preferably 0.1 to 5 Pa. When the pressure of the sputtering gas is adjusted in this range, an Al.Li alloy having an Li concentration in the above-described range can be easily obtained. When the pressure of the sputtering gas is changed in the range during the film formation, the electron injection electrode having the Li concentration gradient can be easily obtained.

As the sputtering gas, an inactive gas for use in a usual sputtering device is usable. In reactive sputtering, instead, reactive gases such as N$_2$, H$_2$, O$_2$, C$_2$H$_4$, and NH$_3$ are usable.

A high-frequency sputtering method or the like using an RF power supply is also possible as the sputtering method, but the DC sputtering method is preferably used, because a film forming rate is easily controlled and a damage onto an organic EL device structural body is reduced. A power of the DC sputtering device is in a range of preferably 0.1 to 10 W/cm$^2$, especially 0.5 to 7 W/cm$^2$. The film forming rate is in a range of preferably 5 to 100 nm/min, especially 10 to 50 nm/min.

The thickness of the electron injection electrode thin film may be not less than a certain thickness with which the electron is sufficiently injected, and may be 0.1 nm or more, preferably 1 nm or more, more preferably 3 nm or more. The upper limit value is not especially limited, and usually the film thickness is 1 to 500 nm, preferably about 3 to 500 nm.

In the organic EL device of the present invention, a protective electrode may also be disposed on the electron injection electrode, that is, on the side opposite to the organic layer. When the protective electrode is disposed, the electron injection electrode is protected from outside air, moisture or the like, the constituting thin film is prevented from being deteriorated, the electron injection efficiency is stabilized, and the device life is rapidly enhanced. Moreover, this protective electrode has a very low resistance. When the resistance of the electron injection electrode is high, the electrode also has a function of a wiring electrode. This protective electrode contains any one or two or more of Al, Al and transition metal (additionally excluding Ti), Ti or titanium nitride (TiN). When they are used alone, the protective electrode preferably contains at least Al: 90 to 100 at %, Ti: 90 to 100 at %, TiN: 90 to 100 mol %. Moreover, when two or more are used, a mixture ratio is optional, but in a mixture of Al and Ti, a content of Ti is preferably 10 at % or less. A layer containing them alone may also be stacked. Especially, when Al, Al and transition metal are used as a wiring electrode described later, a satisfactory effect is obtained, TiN has a high resistance to corrosion, and an effect of a sealing film is large. TiN may also deviate from a stoichiometrical composition by about 10%. Furthermore, the alloy of Al and transition metal may especially preferably contain transition metals such as Mg, Sc, Nb, Zr, Hf, Nd, Ta, Cu, Si, Cr, Mo, Mn, Ni, Pd, Pt, W by 10 at % or less, especially 5 at % or less, especially 2 at % or less. With a less content of the transition metal, a thin film resistance is lowered in a case where the metal functions as a wiring material.

To secure the electron injection efficiency or to prevent penetration of moisture, oxygen, or organic solvent, the thickness of the protective electrode may be not less than a certain thickness, and is in a range of preferably 50 nm or more, further preferably 100 nm or more, especially preferably 100 to 1000 nm. When the protective electrode layer is excessively thin, the above-described effect is not obtained, a step coating property of the protective electrode layer drops, and connection with a terminal electrode is not sufficient. On the other hand, when the protective electrode layer is excessively thick, the stress of the protective electrode layer is large, and therefore a growth rate of a dark spot is high. It is to be noted that the film thickness of the electron injection electrode is small, and therefore a film resistance is high. To compensate for this, the thickness is usually about 100 to 500 nm in a case where the electrode functions as the wiring electrode, and about 100 to 300 nm in a case where the electrode functions as another wiring electrode.

The total thickness of the electron injection electrode and protective electrode is not especially limited, but may be usually about 100 to 1000 nm.

Figure 1:
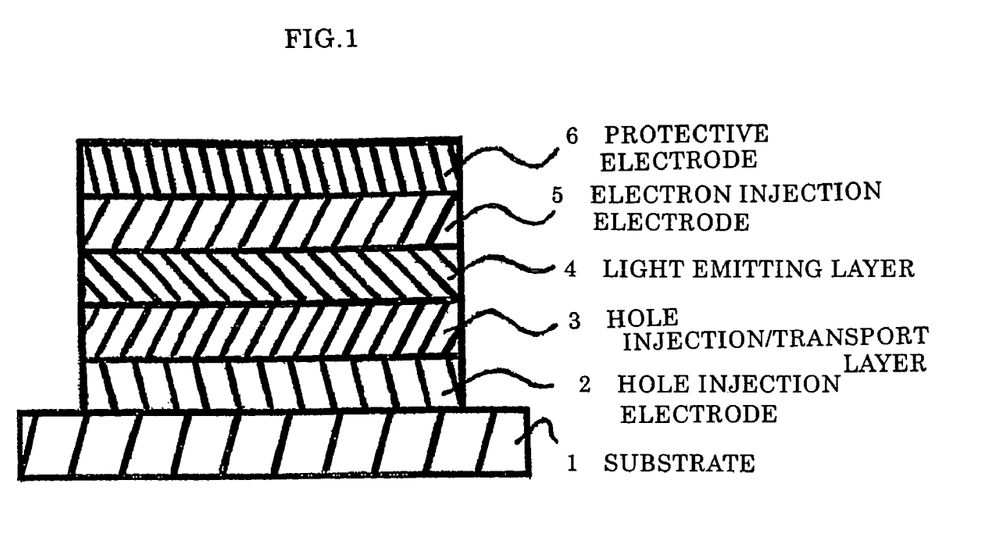
FIG. 1 is a schematic diagram showing a constitution example of an organic EL device.

A constitution example of an organic EL light emitting device manufactured by the present invention is shown in FIG. 1. The EL device shown in FIG. 1 successively includes a hole injection electrode 2, hole injection/transport layer 3, light emitting and electron injection/transport layer 4, electron injection electrode 5, and protective electrode 6 on the substrate 1.

The organic EL device of the present invention is not limited to a shown example, and can be various constitutions. For example, the light emitting layer is disposed alone, and the electron injection/transport layer may also be interposed between the light emitting layer and the electron injection electrode in the structure. Moreover, if necessary, the hole injection/transport layer and the light emitting layer may also be mixed.

The hole injection electrode and electron injection electrode can be formed as described above, and organic layers such as the light emitting layer may be formed by vacuum evaporation or the like, but these films can be patterned by methods such as etching, if necessary, after mask evaporation or film formation, and a desired light emitting pattern can be obtained. Furthermore, a thin film transistor (TFT) is formed on the substrate, each film is formed in accordance with the pattern, and a displaying and driving pattern may also be formed as such.

After the film of the electrode is formed, in addition to the protective electrode, a protective film may also be formed using inorganic materials such as $SiO_x$, organic materials such as Teflon and chlorine-containing fluoride carbon polymer or the like. The protective film may be transparent or opaque, and the protective film has a thickness of about 50 to 1200 nm. The protective film may be formed by a general sputtering method, vapor deposition method or the like in addition to the reactive sputtering method.

Furthermore, a sealing layer is preferably formed on the device in order to prevent the organic layer or the electrode of the device from being oxidized. In the sealing layer, adhesive resin layers such as a commercially available low-absorption photo-setting adhesive for preventing penetration of humidity, silicone-based adhesive, and adhesive resin layers such as a bridged ethylene-vinyl acetate copolymer adhesive sheet are used, and sealing plates such as a glass plate are bonded and sealed. A metal plate, plastic plate and the like may also be used in addition to the glass plate.

Next, an organic layer disposed on the EL device of the present invention will be described. The light emitting layer has an injection function of the hole (positive hole) and electron, transport function, and a function of producing an exciton by recombination of the hole and electron. A comparatively electronically neutral compound is preferably used in the light emitting layer.

The hole injection/transport layer has a function of facilitating the injection of the hole from the hole injection electrode, a function of transporting the hole steadily, and a function of hindering the electron, and the electron injection/transport layer has a function of facilitating the injection of the electron from the electron injection electrode, a function of transporting the electron steadily, and a function of hindering the hole. These layers increase/seal the hole or electron injected in the light emitting layer, optimizes a recombined region, and improves a light emitting efficiency.

The thickness of the light emitting layer, the thickness of the hole injection/transport layer, and the thickness of the electron injection/transport layer are not especially limited, but differ with a forming method, and are usually preferably about 5 to 500 nm, especially 10 to 300 nm.

The thickness of the hole injection/transport layer or the electron injection/transport layer may be set to be approximately equal to or about ⅒ to ten times the thickness of the light emitting layer depending on the design of a recoupling/light emitting region. When each injection layer for the hole or electron is separated from the transport layer, the thickness of the injection layer is preferably 1 nm or more, and the transport layer is 1 nm or more. An upper limit of the thickness of the injection layer or the transport layer at this time, is usually about 500 nm in the injection layer, about 500 nm in the transport layer. This film thickness also applies to a case where two injection/transport layers are disposed.

The light emitting layer of the organic EL device of the present invention contains a fluorescent substance which is a compound having a light emitting function. Examples of the fluorescent substance include a compound described in Japanese Patent Application Laid-Open No. 63-264692, and at least one selected from compounds such as quinacridone, rubrene, and styryl-based dyestuffs. Further examples include quinoline derivatives such as a metal complex dyestuff in which 8-quinolinol such as tris(8-quinolinolate) aluminum and derivative are used as ligand, tetraphenyl butadiene, anthracene, perylene, coronene, 12-phthalo perinone derivative and the like.

Moreover, combined use with a host substance capable of emitting light by itself is preferable, and used as a dopant is preferable. In this case, a content of the compound in the light emitting layer is 0.01 to 10 wt %. further preferably 0.1 to 5 wt %. By the combined use with the host substance, a light emitting wavelength characteristic of the host substance can be changed, emission is possible in which the wavelength shifts to a long wavelength, and the light emitting efficiency or the stability of the device is enhanced.

As the host substance, a quinolinolate complex is preferable, and further an aluminum complex is preferable using 8-quinolinol or derivative as the ligand. Examples include aluminum complexes described in Japanese Patent Application Laid-Open Nos. 63-264692, 3-255190, 5-70733, 5-258859, 6-215874 and the like.

Concrete examples first include tris(8-quinolinolate)aluminum, bis(8-quinolinolate)magnesium, bis(benzo{f}-8-quinolinolate) zinc, bis(2-methyl-8-quinolinolate)aluminum oxide, tris(8-quinolinolate) indium, tris(5-methyl-8-quinolinolate)aluminum, 8-quinolinolate lithium, tris(5-chloro-8-quinolinolate)gallium, bis(5-chloro-8-quinolinolate)calcium, 5,7-dichloro-8-quinolinolate aluminum, tris(5,7-dipromo-8-hydroxyquinolinolate)aluminum, poly[zinc(II)-bis(8-hydroxy-5-quinolinyl)methane] and the like.

Moreover, the substance may also be an aluminum complex including the ligand opposite to 8-quinolinol and the derivative, and examples include bis(2-methyl-8-quinolinolate) (phenolate)aluminum(III), bis(2-methyl-8-quinolinolate) (ortho-cresolate)aluminum(III), bis(2-methyl-8-quinolinolate) (metha-cresolate)aluminum(III), bis(2-methyl-8-quinolinolate) (para-cresolate)aluminum(III), bis(2-methyl-8-quinolinolate) (ortho-phenylphenolate)aluminum(III), bis(2-methyl-8-quinolinolate) (metha-phenylphenolate)aluminum(III), bis(2-methyl-8-quinolinolate) (para-phenylphenolate)aluminum(III), bis(2-methyl-8-quinolinolate) (2,3-dimethylphenolate)aluminum(III), bis(2-methyl-8-quinolinolate) (2,6-dimethylphenolate)aluminum(III), bis(2-methyl-8-quinolinolate) (3,4-dimethylphenolate)aluminum(III), bis(2-methyl-8-quinolinolate) (3,5-dimethylphenolate)aluminum(III), bis(2-methyl-8-quinolinolate) (3,5-di-tert-butylphenolate)aluminum(III), bis(2-methyl-8-quinolinolate)(2,6-diphenylphenolate)aluminum(III), bis(2-methyl-8-quinolinolate) (2,4,6-triphenylphenolate)aluminum(III), bis(2-methyl-8-quinolinolate) (2,3,6-trimethylphenolate)aluminum(III), bis(2-methyl-8-quinolinolate)(2,3,5,6-tetramethylphenolate)aluminum(III), bis(2-methyl-8-quinolinolate) (1-naphtholate)aluminum (III), bis(2-methyl-8-quinolinolate) (3-naphtholate)aluminum(III), bis(2,4-dimethyl-8-quinolinolate) (ortho-phenylphenolate)aluminum(III), bis(2,4-dimethyl-8-quinolinolate) (para-phenylphenolate)aluminum(III), bis(2,4-dimethyl-8-quinolinolate) (metha-phenylphenolate) aluminum(III), bis(2,4-dimethyl-8-quinolinolate) (3,5-dimethylphenolate)aluminum(III), bis(2,4-dimethyl-8-quinolinolate)(3,5-di-tert-butylphenolate)aluminum(III), bis(2-methyl-4-ethyl-8-quinolinolate) (para-cresolate)aluminum(III), bis(2-methyl-4-methoxy-8-quinolinolate) (para-phenylphenolate)aluminum(III), bis(2-methyl-5-cyano-8-quinolinolate) (ortho-cresolate)aluminum(III), bis(2-methyl-6-trifluoromethyl-8-quinolinolate) (2-naphtholate) aluminum(III) and the like.

Additionally, the examples may include bis(2-methyl-8-quinolinolate) aluminum(III)-μ-oxo-bis(2-methyl-8-quinolinolate)aluminum(III), bis(2,4-dimethyl-8-quinolinolate)aluminum(III)-μ-oxo-bis(2,4-dimethyl-8-quinolinolate) aluminum(III), bis(4-ethyl-2-methyl-8-quinolinolate) aluminum(III)-μ-oxo-bis(4-ethyl-2-methyl-8-quinolinolate) aluminum(III), bis(2-methyl-4-methoxyquinolinolate) aluminum(III)-μ-oxo-bis(2-methyl-4-methoxyquinolinolate)aluminum(III), bis(5-cyano-2-methyl-8-quinolinolate)aluminum(III)-μ-oxo-bis(5-cyano-2-methyl-8-quinolinolate)aluminum(III), bis(2-methyl-5-trifluoromethyl-8-quinolinolate) aluminum(III)-μ-oxo-bis(2-methyl-5-trifluoromethyl-8-quinolinolate)aluminum(III) and the like.

As another host substance, a phenyl anthracene derivative described in Japanese Patent Application Laid-Open No. 8-12600, a tetraarylethene derivative described in Japanese Patent Application Laid-Open No. 8-12969, and the like are also preferable.

The light emitting layer may also serve as the electron injection/transport layer, and in this case tris(8-quinolinolate)aluminum or the like is preferably used. These fluorescent substance may be vapor-deposited.

Moreover, if necessary, the light emitting layer is also preferably a mixed layer of at least one or more types of hole injection/transport compounds and at least one or more types of electron injection/transport compounds, and the mixed layer preferably contains a dopant. A content of the compound in this mixed layer is preferably 0.01 to 20 wt %, further preferably 0.1 to 15 wt %.

In the mixed layer, since a hopping conduction path of a carrier is formed, each carrier moves in a dominant polar substance, carrier injection of a reverse polarity does not easily occur, an organic compound is not easily damaged, and there is another advantage that the device life lengthens. However, when the mixed layer contains the dopant, emission wavelength characteristics of the mixed layer itself can be changed, and the emission wavelength can be shifted to the long wavelength. Moreover, an emission intensity can be increased, and stability of the device can be enhanced.

The hole injection/transport compound and electron injection/transport compound for use in the mixed layer may be selected from the compounds for the hole and electron injection/transport layers described later. Above all, as the compound for the hole injection/transport layer, it is also preferable to use an amine derivative having intense fluorescence, for example, a triphenyl diamine derivative which is the hole transport material, further a styryl amine derivative, and an amine derivative having an aromatic condensed ring.

As the electron injection/transport compound, a quinoline derivative, further a metal complex including 8-quinolinol or the derivative as ligand, especially tris(8-quinolinolate) aluminum (Alq3) are preferably used. Moreover, the above-described phenyl anthracene derivative, and tetraarylethene derivative are also preferably used.

In this case, a mixture ratio is determined in consideration of carrier mobility and carrier concentration, but in general, a weight ratio of the compound having the compound/electron injection/transport function in the hole injection/transport compound is preferably 1/99 to 99/1, further preferably 10/90 to 90/10, especially preferably about 20/80 to 80/20.

Moreover, the thickness of the mixed layer preferably ranges from a thickness corresponding to a molecular layer to be less than the film thickness of the organic compound layer, and is concretely preferably 1 to 85 nm, further preferably 5 to 60 nm, especially preferably 5 to 50 nm.

Moreover, as a method of forming the mixed layer, co-evaporation for evaporation from different evaporation sources is preferable. However, when a steam pressure (evaporation temperature) is substantially equal or very close, the layers may also be mixed in the same evaporation board, and evaporated. In the mixed layer, the compounds are preferably uniformly mixed. However, as the case may be, the compounds may exist in insular forms. In the light emitting layer, in general, an organic fluorescent substance is evaporated, or is dispersed in a resin binder to coat the layer, and accordingly the light emitting layer is formed in a predetermined thickness.

Moreover, in the hole injection/transport layer, for example, various organic compounds described in Japanese Patent Application Laid-Open Nos. 63-295695, 2-191694, 3-792, 5-234681, 5-239455, 5-299174, 7-126225, 7-126226, 8-100172, EP-650955A1 and the like are usable. The examples include a tetra aryl benzidine compound (triaryl diamine or triphenyl diamine: TPD), aromatic class 3 amine, hydrazone derivative, carbazole derivative, triazole derivative, imidazole derivative, oxadiazole derivative having an amino group, polythiophen and the like. Two or more types of these compounds may also be used, the compounds for combined use may be stacked in separate layers, and mixed.

When the hole injection/transport layer is divided and stacked in the hole injection layer and hole transport layer, a preferable combination can be selectively used from the compounds for the hole injection/transport layer. At this time, the layers are preferably stacked in order from a compound having a small ionization potential from a hole injection electrode (ITO, etc.) side. A compound having a satisfactory thin film property is preferably used on a hole injection electrode surface. This stacking order also applies to a case where two or more hole injection/transport layers are disposed. By this stacking order, a driving voltage drops, and the generation of a current leak or generation/growth of a dark spot can be prevented. When the device is formed, evaporation is used. Therefore, an about 1 to 10 nm thin film can be uniform and pinhole free. Even with the use of a compound having a small ionization potential and having absorption in a visible portion in the hole injection layer, the efficiency can be prevented from dropping because of color change of emitted color or re-absorption. The hole injection/transport layer can be formed by evaporation of the above-described compound in the same manner as in the light emitting layer.

Moreover, in the electron injection/transport layer disposed if necessary, quinoline derivatives such as the organic metal complex using 8-quinolinol such as tris(8-quinolinolate)aluminum (Alq3) or the derivative as ligand, oxadiazole derivative, beryline derivative, pyridine derivative, pyrimidine derivative, quinoxaline derivative, diphenylquinone derivative, nitro substituent fluorine derivative and the like are usable. In this case, tris(8-quinolinolate)aluminum or the like is preferably used. The electron injection/transport layer may be formed by vapor deposition or the like in the same manner as in the light emitting layer.

When the electron injection/transport layer is divided and stacked in the electron injection layer and electron transport layer, a preferable combination can be selectively used from the compounds for the electron injection/transport layer. At this time, the layers are preferably stacked in order from a compound having a large electron affinity value from an electron injection electrode side. This stacking order also applies to a case where two or more electron injection/transport layers are disposed.

The emitted color may be controlled using a color change film indicating a color filter film or a fluorescent substance in the substrate, or a derivative reflective surface.

A color filter for use in a liquid crystal display or the like may be used in the color filter film, but the characteristics of the color filter may be adjusted in accordance with the color emitted by organic EL to optimize taking efficiency/color purity.

Moreover, by the use of a color filter capable of cutting outside light having a short wavelength optically absorbed by EL device materials or fluorescent conversion layer, light resistance of the device or contrast of the display is also enhanced.

Moreover, optical thin films such as a derivative multi-layered film may also be used instead of the color filter.

The fluorescent conversion filter film absorbs EL emitted light, and discharge the light from a fluorescent body in the fluorescent conversion film to change the emitted color, and the composition is formed by three: a binder; a fluorescent material; and a photo-absorption material.

A fluorescent material basically having a high fluorescent quantum yield may be used, and absorption is preferably intense in an EL emitted wavelength region. In actual, a laser dyestuff or the like is suitable, and rhodamine-based compound, beryline-based compound, cyanine-based compound, phthalocyanine-based compound (also including sub-phthalo etc.), naphthaloimide-based compound, condensed ring hydrocarbon-based compound, condensed complex ring-based compound, styryl-based compound, coumarine-based compound and the like are usable.

A material which does not basically extinguish fluorescence may be selected as a binder, and a material capable of performing microfine patterning is preferable in photolithography, printing or the like. A material which is not damaged at the film forming time of ITO is preferable.

An optical absorption material is used, when optical absorption of the fluorescent material is insufficient, but may not be used, if not necessary. An optical absorption material which does not extinguish the fluorescence of the fluorescent material may be selected.

A vacuum evaporation method is preferably used, because homogeneous thin films can be formed in forming the hole injection/transport layer, light emitting layer, and electron injection/transport layer. When the vacuum evaporation method is used, a homogeneous thin film having an amorphous state or a crystal particle diameter of 0.1 µm or less is obtained. When the crystal particle diameter exceeds 0.1 µm, nonuniform emission results, the driving voltage of the device has to be raised, and injection efficiency of charges remarkably drops.

The conditions of the vacuum evaporation are not especially limited, but a vacuum degree of $10^{-4}$ Pa or less is set, and an evaporation rate is preferably set to about 0.01 to 1 nm/sec. The respective layers are preferably formed continuously in vacuum. When the layers are continuously formed in vacuum, impurities can be inhibited from being adsorbed in the interface between the layers, and therefore high characteristics are obtained. The driving voltage of the device can be lowered, and the dark spot can be inhibited from growing/being generated.

When the vacuum evaporation method is used in forming the respective layers, and when one layer contains a plurality of compounds, ports via which the compounds are injected are preferably controlled at temperature and co-evaporated.

The organic EL device of the present invention may also be driven by a direct current, pulse, or alternating current. An applied voltage is usually set to about 2 to 30 V.

BEST MODE FOR CARRYING OUT THE INVENTION

The present invention will be described hereinafter in accordance with examples in further detail, but the scope of the present invention is not limited to the examples.

EXAMPLE 1

An ITO film was prepared on a glass substrate by a pyro-sol method. That is, an alkali glass substrate (250× 250×1 mm) pre-coated with an $SiO_2$ film (film thickness of 150 nm) was projected into a conveyor furnace heated at 500° C. by a belt conveyor, an acetyl acetone solution of stannic chloride-indium acetyl acetone containing 5% by atom of tin atoms was formed in fog drips. Air was used as a carrier gas, blown into the conveyor furnace, brought into contact with the surface of a glass substrate, and thermally decomposed to form the ITO film. A surface resistance value of the obtained ITO film was 25 Ω/□ and a film thickness was 100 nm. In observation of the film surface by AFM, 100 or more 5 nm to 30 nm protrusions were observed in a 1 µm square, an average surface roughness (Ra) was 1.5 nm, and a maximum surface roughness (Rmax) was 18 nm. As a result of X-ray diffraction, the film was preferentially oriented in a (400) surface, and an X-ray intensity ratio of (400)/(222) was 5.82.

Moreover, when a composition of metal atoms in the film was measured using ESCA, an indium/tin atomic ratio was a certain ratio in a depth of a substrate direction from the surface, and atoms existed within an error range of 10% or less.

An EL device was prepared using glass provided with the ITO film adjusted as described above. On the ITO film which was cleaned and from whose surface organic materials were removed, a vacuum evaporation method was used, a hole transport layer of N,N'-diphenyl-N,N'-di(m-tryl) benzidine (abbreviation: TPD) having a film thickness of 30 nm, a light emitting layer of an aluminoquinolinol complex (abbreviation: Alq3) having a thickness of 50 um, and finally a counter electrode of an Ag—Mg alloy (weight ratio Ag/Mg=1/10) having a thickness of 200 nm were successively stacked to prepare an organic EL device.

A direct-current voltage was applied to the organic EL device prepared as described above every 0.5 V to check a relation of a voltage (V)-current density (mA/cm$^2$)-emission luminance (cd/cm$^2$). As a result, a current density for emission of 100 cd/cm$^2$ was 3.7 mA/cm$^2$, and a voltage was 4.3 V. Moreover, a maximum emission luminance was 16300 cd/cm$^2$ at the time of application of 11.5 V.

COMPARATIVE EXAMPLE 1

An ITO film was prepared on a glass substrate by a sputtering method. That is, an alkali glass substrate (250× 250×1 mm) pre-coated with an SiO$_2$ film (film thickness of 150 nm) was set in a film forming chamber, and a pressure was reduced to $1.3 \times 10^{-3}$ Pa. ITO (In$_2$O$_3$ containing 10 wt % of SnO$_2$) was used as a target, Ar+O$^2$ (flow rate=100:1) was used as a sputtering gas, and an ITO thin film was formed in a thickness of 100 nm at a pressure of $3.1 \times 10^{-1}$ Pa at the time of the sputtering and in a DC sputtering power of 1.7 kW. A substrate temperature at a film forming time was 300° C. When a composition of the obtained ITO thin film was checked, In$_2$O$_3$: 90.2 wt %, SnO$_2$: 9.8 wt %. As a result of X-ray diffraction of the ITO thin film obtained without performing any heating treatment, the film was preferentially oriented in a (222) surface, and an X-ray intensity ratio of (400)/(222) was 0.69. A surface resistance value was 17 Ω/□. In observation by AFM, 70 to 80 5 to 30 nm protrusions were observed in a 1 μm square, an average surface roughness (Ra) was 9.4 nm, and a maximum surface roughness (Rmax) was 72 nm.

Moreover, when a composition of metal atoms in the film was measured using ESCA, a tin atomic ratio was 20% on the surface, and segregation of tin atoms was observed in the surface.

An EL device was prepared using glass provided with the ITO film adjusted as described above in the same manner as in Example 1.

A direct-current voltage was applied to the organic EL device prepared as described above every 0.5 V to check a relation of a voltage (V)-current density (mA/cm$^2$)-emission luminance (cd/cm$^2$). As a result, a current density for emission of 100 cd/cm$^2$ was 4.6 mA/cm$^2$, and a voltage was 4.2 V. Moreover, a maximum emission luminance was 14000 cd/cm$^2$ at the time of application of 9 V.

In comparison of Example 1 with Comparative Example 1, the current density for the emission with luminance of 100 cd/cm$^2$ of Example 1 was lower, and it can be said that emission is possible at a low current density. This means that the device can be driven at a lower voltage in a case where a film having an equal surface resistance is used. The maximum emission luminance of Example 1 is higher in the equal driving voltage. When the above description is put together, it can be said that the EL device of the present invention has emission characteristics with a lower voltage and a higher luminance as compared with a conventional device.

INDUSTRIAL APPLICABILITY

As described above, by use of an electrode including a conductive film of the present invention, the electrode is driven with a lower voltage or current amount as compared with a conventional electrode. Since a higher-luminance emission is achieved at an applied voltage having an equal voltage or current amount, an EL device indicating a less power consumption and having a longer life can be manufactured, and an industrial use value can be said to be high.

The invention claimed is:

1. An EL device comprising:
    a light emitting layer disposed as an essential layer between two electrodes facing each other,
    wherein at least one of the electrodes includes a crystalline conductive film surface whose diffraction intensity ratio of (400)/(222) is 1.0 or more in X-ray diffraction by a θ/2θ process,
    wherein the crystalline conductive film is a crystal aggregate in which a size of a crystallite in a longitudinal direction is in a range of 20 to 100 nm,
    wherein an organic compound is used in the light emitting layer.

2. The EL device according to claim 1, wherein the crystalline conductive film is an aggregate of columnar single crystals.

3. The EL device according to claim 1, wherein a maximum surface roughness of the crystalline conductive film is in a range of 5 to 30 nm.

4. The EL device according to claim 1, wherein an average surface roughness of a crystalline conductive film surface is in a range of 1 to 10 nm.

5. The EL device according to claim 1, wherein a number of 5 to 30 nm protrusions existing in a 1 μm square region in the crystalline conductive film surface is 100 or more.

6. The EL device according to claim 1, wherein at least one of the electrodes is a hole injection electrode.

7. An EL device comprising:
    a light emitting layer disposed as an essential layer between two electrodes facing each other,
    wherein a number of 5 to 30 nm protrusions existing in a 1 μm square region in a surface of at least one of the electrodes is 100 or more and
    wherein an organic compound is used in the light emitting layer.

8. The EL device according to claim 7, wherein a maximum surface roughness of at least one of the electrodes is in a range of 5 to 30 nm.

9. The EL device according to claim 7, wherein an average surface roughness of at least one of the electrodes is in a range of 1 to 10 nm.

10. The EL device according to claim 7, wherein at least one of the electrodes is an aggregate of crystals having a (100) surface orientation.

11. The EL device according to claim 7, wherein at least one of the electrodes comprises a crystal aggregate in which a size of a crystallite in a longitudinal direction is in a range of 20 to 100 nm.

12. The EL device according to claim 7, wherein at least one of the electrodes is an aggregate of columnar single crystals.

13. The EL device according to claim 7, wherein at least one of the electrodes is a hole injection electrode.

* * * * *

UNITED STATES PATENT AND TRADEMARK OFFICE
CERTIFICATE OF CORRECTION

| | | |
|---|---|---|
| PATENT NO. | : 7,309,531 B2 | Page 1 of 1 |
| APPLICATION NO. | : 10/495880 | |
| DATED | : December 18, 2007 | |
| INVENTOR(S) | : Hiroshi Suzuki et al. | |

It is certified that error appears in the above-identified patent and that said Letters Patent is hereby corrected as shown below:

On the Title Page: item (73),

Delete "Japan" and substitute with --Tokyo, Japan--

Signed and Sealed this

Thirteenth Day of May, 2008

JON W. DUDAS
*Director of the United States Patent and Trademark Office*